US012580330B2

(12) United States Patent
Koerner et al.

(10) Patent No.: US 12,580,330 B2
(45) Date of Patent: Mar. 17, 2026

(54) ELECTRICAL FEED CONNECTOR SYSTEM AND METHOD FOR LIGHT EMITTING DIODE (LED) CIRCUIT BOARDS WITH VARIED PLACEMENT OF WIRE TERMINAL CONNECTION POINTS

(71) Applicant: LuxTech, LLC, Philadelphia, PA (US)

(72) Inventors: Brad Koerner, Amsterdam (NL);
Graham Merrifield, Utrecht (NL);
Kyle Davis, Jacksonville, FL (US);
Scott Soma, Philadelphia, PA (US);
Cooper Hurley, Philadelphia, PA (US)

( * ) Notice: Subject to any disclaimer, the term of this patent is extended or adjusted under 35 U.S.C. 154(b) by 295 days.

(21) Appl. No.: 18/458,464

(22) Filed: Aug. 30, 2023

(65) Prior Publication Data

US 2024/0072461 A1     Feb. 29, 2024

Related U.S. Application Data

(60) Provisional application No. 63/402,123, filed on Aug. 30, 2022.

(51) Int. Cl.
| | |
|---|---|
| *H01R 12/63* | (2011.01) |
| *H01R 12/51* | (2011.01) |
| *H05K 1/18* | (2006.01) |
| *H05K 3/32* | (2006.01) |

(52) U.S. Cl.
CPC .......... *H01R 12/63* (2013.01); *H01R 12/515* (2013.01); *H05K 1/18* (2013.01); *H05K 3/32* (2013.01); *H05K 2201/10106* (2013.01); *H05K 2201/10189* (2013.01); *H05K 2203/166* (2013.01)

(58) Field of Classification Search
CPC .... F21V 21/005; F21V 23/06; F21Y 2103/10; F21Y 2115/10; F21S 4/28; H01R 13/7175; H01R 12/63; H01R 12/515
See application file for complete search history.

(56) References Cited

U.S. PATENT DOCUMENTS 9,293,848 B2 *   3/2016  Zantout .............. H01R 12/7029

* cited by examiner

*Primary Examiner* — William J Carter
(74) *Attorney, Agent, or Firm* — COOLEY LLP

(57) ABSTRACT

A system comprises a printed circuit board (PCB) substrate and a housing. The PCB substrate has a plurality of light emitting diodes (LEDs), a first plurality of electrical conductor portions and a second plurality of electrical conductor portions. The housing has a first side and a second side opposite the first side. The housing has on the first side a first wire terminal and a second wire terminal. The housing has on the second side a first conductor contact and a second conductor contact. The housing is configured to be attachable to the PCB substrate so that first conductor contact is electrically coupled to an electrical conductor portion from the first plurality of electrical conductor portions and the second conductor contact is electrically coupled to an electrical conductor portion from the second plurality of electrical conductor portions.

16 Claims, 5 Drawing Sheets

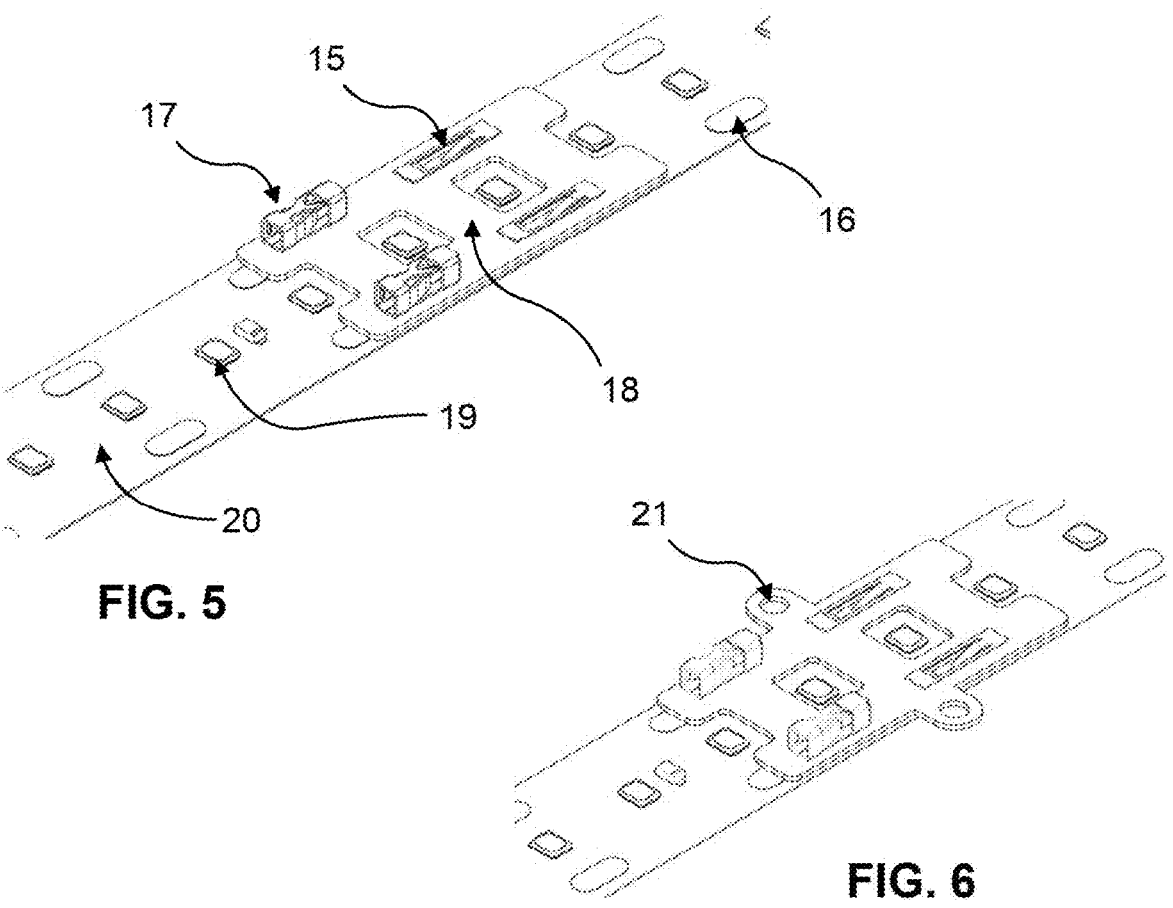
FIG. 5
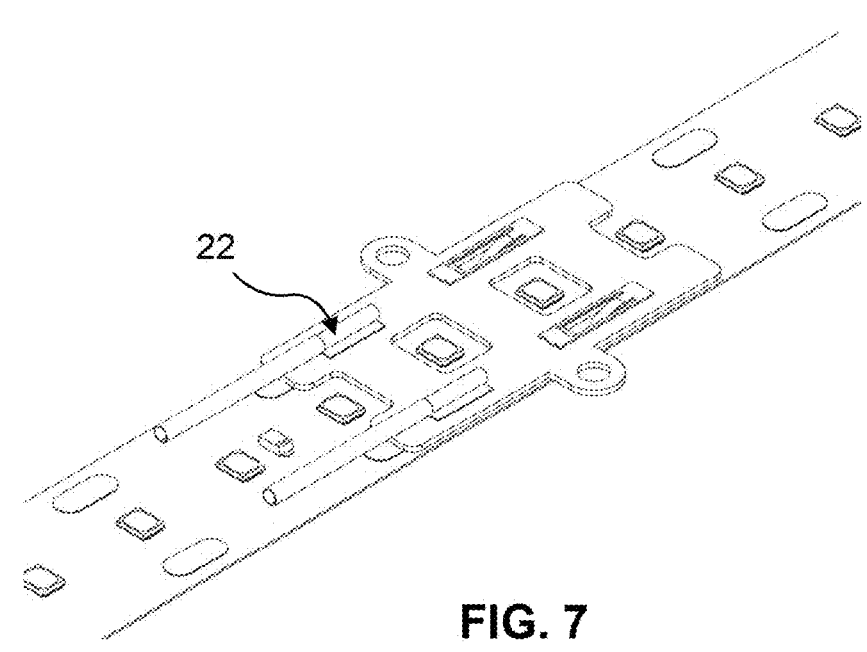
FIG. 6
FIG. 7

ELECTRICAL FEED CONNECTOR SYSTEM AND METHOD FOR LIGHT EMITTING DIODE (LED) CIRCUIT BOARDS WITH VARIED PLACEMENT OF WIRE TERMINAL CONNECTION POINTS

CROSS-REFERENCE TO RELATED APPLICATIONS

This application claims priority to U.S. Provisional Patent Application No. 63/402,123 entitled "Electrical Feed Connector System and Method for Light Emitting Diode (LED) Circuit Boards with Varied Placement of Wire Terminal Connection Points" and filed Aug. 30, 2022, the contents of which are incorporated herein by reference.

FIELD

The present disclosure relates generally to flexible circuit electronics for light emitting diode (LED) lighting sources.

BACKGROUND

Printed circuit boards (PCBs) with light emitting diodes (LEDs) are commonly employed in linear or planar configurations as light engines for a variety of applications, including architectural lighting fixtures. These LED PCBs are commonly available using either rigid or flexible substrates. Rigid substrate LED PCBs are typically offered in predetermined lengths up to 600 mm. Flexible substrate LED PCBs are typically sold in continuous roll formats up to many meters in length. These flexible substrate LED PCB's are then typically cut-to-length or cut into other shapes as desired to fit the application.

A LED PCB is typically connected to a driver or other power source using an electrical wire interconnect. Previously, these electrical wire interconnects were soldered directly to the PCB, but now LED PCBs can include terminal blocks of various styles that allow simplified "push in" direct connection of wires (e.g., wires for a driver or other power source) without the need to solder wires directly to the PCB. These terminal blocks are typically permanently mounted to the PCB typically through a common SMD (surface mounted device) soldered attachment process. Because these terminal blocks are typically placed on the LED PCB before an architectural fixture is assembled, coordination is used for placing the wire feed (i.e., the wire interconnect of the terminal block(s)) in the correct position within the architectural fixture for connection to the PCB.

SUMMARY

A system comprises a printed circuit board (PCB) substrate and a housing. The PCB substrate has a plurality of light emitting diodes (LEDs), a first plurality of electrical conductor portions and a second plurality of electrical conductor portions. The housing has a first side and a second side opposite the first side. The housing has on the first side a first wire terminal and a second wire terminal. The housing has on the second side a first conductor contact and a second conductor contact. The housing is configured to be attachable to the PCB substrate so that first conductor contact is electrically coupled to an electrical conductor portion from the first plurality of electrical conductor portions and the second conductor contact is electrically coupled to an electrical conductor portion from the second plurality of electrical conductor portions.

BRIEF DESCRIPTION OF THE DRAWINGS

FIG. 5 shows an isometric view of an LED PCB having discontinuous electronic conductors and attached to a terminal block housing, according to an embodiment.

FIG. 6 shows an isometric view of an LED PCB having discontinuous electronic conductors and attached to an alternative terminal block housing, according to an embodiment.

FIG. 7 shows an isometric view of an LED PCB having discontinuous electronic conductors and attached to an alternative terminal block housing, according to an embodiment.

DETAILED DESCRIPTION

Architectural fixture housings are often fabricated to custom lengths (e.g., predefined before installation), and include custom lengths or shapes of LED PCBs. As a practical supply chain consideration, LED PCBs are now often being designed with the ability to be cut-to-fit at the latest possible stage of fixture assembly, reducing or eliminating the need for predetermined, premanufactured LED PCB components manufactured and stocked for each specific architectural fixture shape or size. Manually soldering the wire feed (i.e., the wire interconnect of the terminal block(s)) directly to the PCB LED is not a desired method of attachment for most architectural fixture manufacturers. It is labor intensive, difficult to do within the constricted confines of a housing of an architectural fixture and many times can prove problematic for process quality control.

Many manufacturers prefer wire terminal blocks that allow for rapid connection of wire feeds without soldering or secondary operations. Coordinating the placement of cut-to-fit LED PCBs such that the wire solder connections or wire terminal blocks are positioned at the appropriate points is a coordination hassle for architectural fixture manufacturers. Using LED PCBs within linear architectural fixture housings presents a challenge in attaching a wire connection along the length of the LED PCB. A related problem exists using planar or irregular shaped LED PCBs and locating the wire connection. The length of the wire, the safe routing of the wiring, the strain relief and connection to the LED PCB are coordinated during the final assembly of the architectural fixture. Complicating the wiring routing is that the wire terminals are effectively in randomized positions if the LED PCBs are cut from longer stock to match the length of each unique architectural fixture. Flexible LED PCBs of longer length will have terminal blocks at fixed intervals, but as these are typically cut-to-fit from a longer roll format, and the terminal blocks often end up at random positions within a fixture housing. A related issue for rigid LED PCBs occurs when lengths of the LED PCB are cut as waste to properly position the terminal blocks along the length of the fixture.

One or more embodiments described herein solve the challenge of properly positioning the wire terminal blocks (also referred to herein as "terminal blocks" or "terminal block housings") in respect to an architectural fixture housing by not fixing the terminal blocks to the LED PCBs ahead of installation into the architectural fixture. The one or more embodiments maintain the flexibility of connecting a wire feed anywhere across the surface of an LED PCB, while retaining the convenience of a "push in" or other common styles of wire terminal and eliminating (or reducing) the need for soldering either the direct wire connection or the surface mounted device (SMD) terminal block.

Figures 1, 2, 3, 4:
FIG. 1 shows an isometric view of an LED PCB having continuous-run electronic conductors and attached to a terminal block housing, according to an embodiment.
FIG. 2 shows a bottom isometric view of the terminal block housing of FIG. 1.
FIG. 3 shows an isometric view of an LED PCB having continuous-run electronic conductors and attached to an alternative terminal block housing, according to another embodiment.
FIG. 4 shows an isometric view of an LED PCB having continuous-run electronic conductors and attached to an alternative terminal block housing, according to yet another embodiment.

Rather, freely-placed terminal blocks are adhered, fastened, or mounted in place at various positions across the LED PCB to mate with the corresponding electrical contacts. For example, see FIGS. 1 and 2. FIG. 1 shows an isometric view of an LED PCB with a terminal block housing, according to an embodiment. As shown in FIG. 1, PCB substrate 1 is coupled to multiple LEDs 2 and electrical conductors 3 (which are exposed electrical conductors with a continuous run configuration); the terminal block housing 5 includes integrated push-in wire terminals. As shown in FIG. 2, the terminal block housing 5 includes electrical contacts 9 and an adhesive 10, which can be used to adhere the terminal block housing 5 to the PCB substrate 1.

When installing an LED PCB into an architectural fixture housing, the LED PCB can be placed first if desired, then the terminal block housing can be placed wherever desired in the architectural fixture housing. Alternatively, the terminal block housing can be pre-assembled to the precut LED PCB outside of the architectural fixture if desired.

Placing the terminal block anywhere across the LED PCB is accomplished by several features of the LED PCB. First, exposed electrical conductor pads are provided (disposed) along the surface of the PCB substrate, in either continuous or segmented sections. The number and positioning of electrical conductor pads can accommodate various numbers of electrical circuits as desired (or needed). Second, conductive contacts are provided (disposed) on the bottom of the terminal blocks, which make contact with the electrical conductor pads on the PCB substrate when the terminal block is properly positioned on the PCB substrate. The electrical conductive pads in the terminal block pass electricity through the terminal block into the electrical feed wires connecting to the driver or power supply (not shown).

The terminal block unit can be secured to the PCB substrate, for example, by adhesive or mechanical fastener, compressive assembly, press fit pins, or some other fixation technique. The terminal blocks can be fabricated in various fashions. For example, the terminal block can be (or include) a rigid or flexible PCB with electrical contacts or wire terminals directly mounted to the terminal block PCB using known surface-mount technology (SMT) or known hand soldered techniques (see, e.g., FIGS. 5 and 7). The terminal block can be, for example, opaque or transparent to prevent obscuring the light source (see, e.g., FIG. 8). The terminal block can be or include, for example, a physical housing or molded plastic or some other material, with metal conductors or spring features inserted or mounted into the housing (FIG. 1). The terminal block can include various styles of wire terminals including for example spring-loaded push-in style, screw terminals, insulation-displacement contact, JST, and soldering pads (see, e.g., FIGS. 1, 5, 7). The terminal block can include various styles of conductive electrical contacts between the terminal block and the PCB substrate, including for example various styles of spring contacts, piercing and clamping conductors, or press fit pins, and can be for example, carbon, gold, nickel plated conductive pads (see, e.g., FIG. 10).

The terminal block can include secondary features. For example, the terminal block can include, for example, additive or subtractive features that temporarily connect with production tools or jigs (also referred to herein as "alignment tools") to properly align and install the terminal blocks onto the LED PCB (see, e.g., FIG. 3). For another example, the terminal block can include secondary posts, clips, channels and/or other features to help route or contain the wire connections as needed (see, e.g., FIG. 3). The terminal block can also include features for electrical test (such as continuity or impedance testing) or physical (such as applied pressure) procedures to ensure the installation is completed correctly.

The LED PCB exposes a conductive area in various implementations, from periodic individual segments to continuous linear rails. In some implementations, the conductive area is not exposed to allow piercing conductors to pierce the insulating cover/coating of the continuous linear rails and to make electrical connection. In some other implementations, conductive through holes are used.

Figure 11:
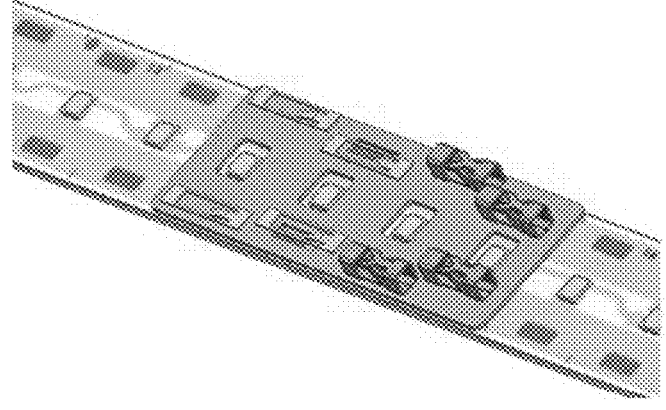
FIG. 11 shows an isometric view of an LED PCB with a terminal block housing having four electrical conductors, according to an embodiment.

Although many of the embodiments and implementations described above show an LED PCB with two electrical conductor paths (e.g., two continuous-run electrical conductors or two discontinuous-run electrical conductors), it should be understood that in some embodiments and implementations LED PCBs can have more than two electrical conductors/conductor paths. For example, FIG. 11 shows an example of an LED PCB with a segment with four electrical conductors/conductor paths. The example of FIG. 11 also shows four wire terminals, one for each electrical conductors/conductor path.

In a linear architectural lighting fixture, one or more flexible LED PCBs described herein is adhered into the structural body of the fixture. For example, the manufacturer (or installer) can choose to place the terminal blocks anywhere along the length of the fixture to best accommodate the desired wire routing for the electrical feed to the LED PCB. This might be at one end of the fixture, or anywhere in the middle of the fixture. The manufacturer (or installer) places the terminal block to be properly aligned with the electrical conductors.

FIG. 1 shows an isometric view of an LED PCB having continuous-run electronic conductors and attached to a terminal block housing, according to an embodiment. As shown in FIG. 1, PCB substrate 1 has multiple LED components 2 disposed periodically along a center (centerline) of and the top surface of the PCB substrate 1. The PCB substrate 1 also has two exposed electrical conductors (continuous run configuration) 3 disposed on each long edge and the top surface PCB structure 1. Terminal block housing 5 is a mechanical part that can be positioned and attached to any location on the PCB substrate using, for example, an adhesive. Terminal block housing 5 includes integrated push-in wire terminals 6 that can receive wire feeds 4 when wire feeds 4 are pushed into the wire terminals 6.

FIG. 2 shows a bottom isometric view of the terminal block housing 5 of FIG. 1. As shown in FIG. 2, the underside of terminal block housing 5 includes electrical contacts 9 and adhesive 10 between the nearest LED component 2 and the edge of the terminal block housing 5. One electrical contact 9 electrically couples the wire terminal 6 to the exposed electrical conductor 3 when the terminal block housing 5 is placed onto and adhered to the PCB substrate 1. Similarly, the other electrical contact 9 electrically couples the wire terminal 4 to the other exposed electrical conductor 3 when the terminal block housing 5 is placed onto and adhered to the PCB substrate 1. The terminal block housing 5 further includes two apertures each of which can receive a LED component 2 when the terminal block housing 5 is placed on the PCB substrate 1.

FIG. 3 shows an isometric view of an LED PCB having continuous-run electronic conductors and attached to a terminal block housing having a tool alignment feature and a wire routing/management feature, according to an embodiment. More specifically, the terminal block housing 5 includes two tool alignment features 11. The two tool alignment features 11 are protrusions (projections) from the upper surface of the terminal block housing 5 that can complimentarily fit into recesses of a tool (not shown) to align the tool relative to the terminal block housing 5. The wire routing/management features 12 are protrusions (projections) that can be used to guide a wire feed 4 from one side of the terminal block housing 5 to the other side of the terminal block housing 5.

FIG. 4 shows an isometric view of an LED PCB having a terminal block housing with a mechanical fastener, according to an embodiment. As shown in FIG. 4, the terminal block housing 13 can be coupled (e.g., fixedly coupled, removably coupled, fastened) to the PCB substrate by the mechanical fastener 14. For example, the terminal block housing 13 can include an aperture through which the mechanical fastener 14 is received. The mechanical fastener 14 can have one portion on one side (e.g., upper side) and another portion on the other side (e.g., lower side) such that the two portions can mate/complementary fit to maintain the location of the terminal block housing 13 at a given longitudinal (lengthwise) location relative to the LED PCB and at a given widthwise location relative to the PCB substrate.

FIG. 5 shows an isometric view of an LED PCB having multiple LED components and a terminal block having a PCB substrate, according to an embodiment. As shown in FIG. 5, multiple LED components 19 are located on PCB substrate 20 at various locations lengthwise and centered widthwise (along a centerline). The PCB substrate 20 also includes discontinuous, exposed conductive pads/connections 16. A terminal block 18 can be attached to the PCB substrate 20 such that terminal block 18 can be electrically coupled to the PCB substrate 20 at two exposed conductive pads 16. The terminal block 18 can be formed from a separate PCB substrate (also referred to herein as a "terminal block PCB"; e.g., a rigid PCB substrate that is shorter than the PCB substrate 20). The terminal block 18 can include two apertures (windows) that allow light emitted from the associated LEDs to travel without being blocked by the terminal block 18. The terminal block 18 includes electrical contact spring features 15 and push-in wire terminals 17. The two electrical contact spring features 15 contact a pair of conductive pads when the terminal block 18 is attached to the PCB substrate 20.

FIG. 6 shows an isometric view of an LED PCB having multiple LED components and a terminal block, according to another embodiment. More specifically, the terminal block 21 of FIG. 6 is similar to the terminal block 18 of FIG. 5, but includes a pair of fasteners, one of each lengthwise side of the terminal block 21.

FIG. 7 shows an isometric view of an LED PCB having multiple LED components and a terminal block, according to another embodiment. More specifically, the terminal block of FIG. 7 is similar to the terminal block 21 of FIG. 6, but includes two wire feeds 22 (e.g., direct soldered style connection) rather than push-in wire terminals (such as the push-in wire terminals 17 of FIG. 5).

Figure 8:
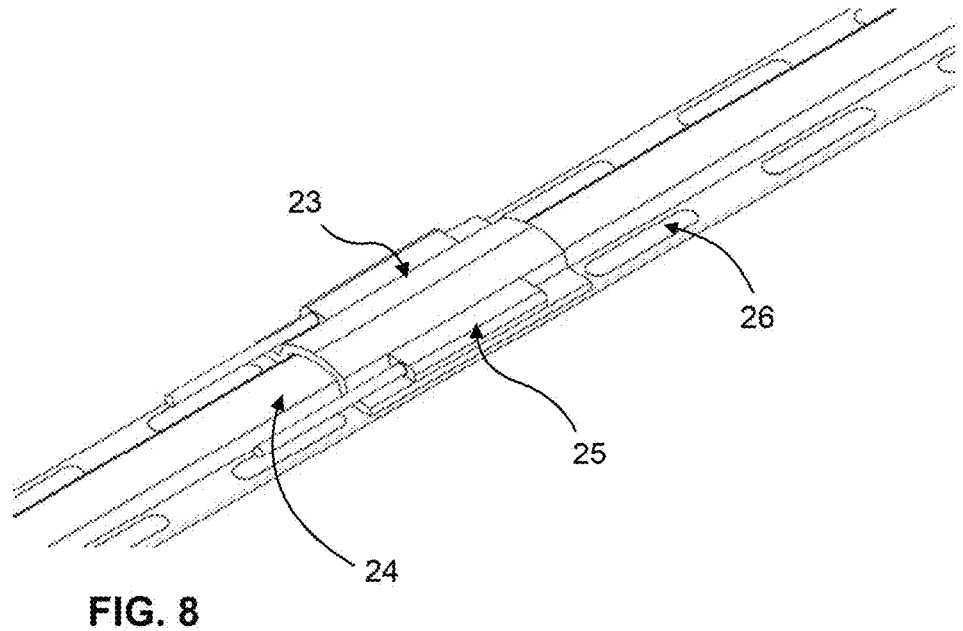
FIG. 8 shows an isometric view of an LED PCB having discontinuous electronic conductors and a continuous LED and attached to a terminal block housing, according to an embodiment.

FIG. 8 shows an isometric view of an LED PCB with a continuous strip of a light emitting surface, according to an embodiment. More specifically, the PCB substate is coupled to LEDs 24 that are in a continuous strip (continuous strip configuration) that collectively form a continuous light emitting surface. The PCB substrate is also coupled to discontinuous, exposed conductive pads 26 to which a terminal block 23 can be connected. The upper surface of the terminal block 23 can be made material that is transparent or translucent to allow light emitted from the continuous light emitting surface for LEDs 24 to pass through the terminal block 23. In other words, the terminal block 23 (or at least the upper surface of the terminal block 23) can be transparent or translucent so as to not block (or obstruct, or absorb) light emitted from the continuous light emitting surface for LEDs 24. The terminal block 23 can include push-in wire terminals 25, one on the lengthwise side of the terminal block 23 and the other on the opposite side of the terminal block 23, which can receive wires coupled to an external power source (not shown).

Figure 9:
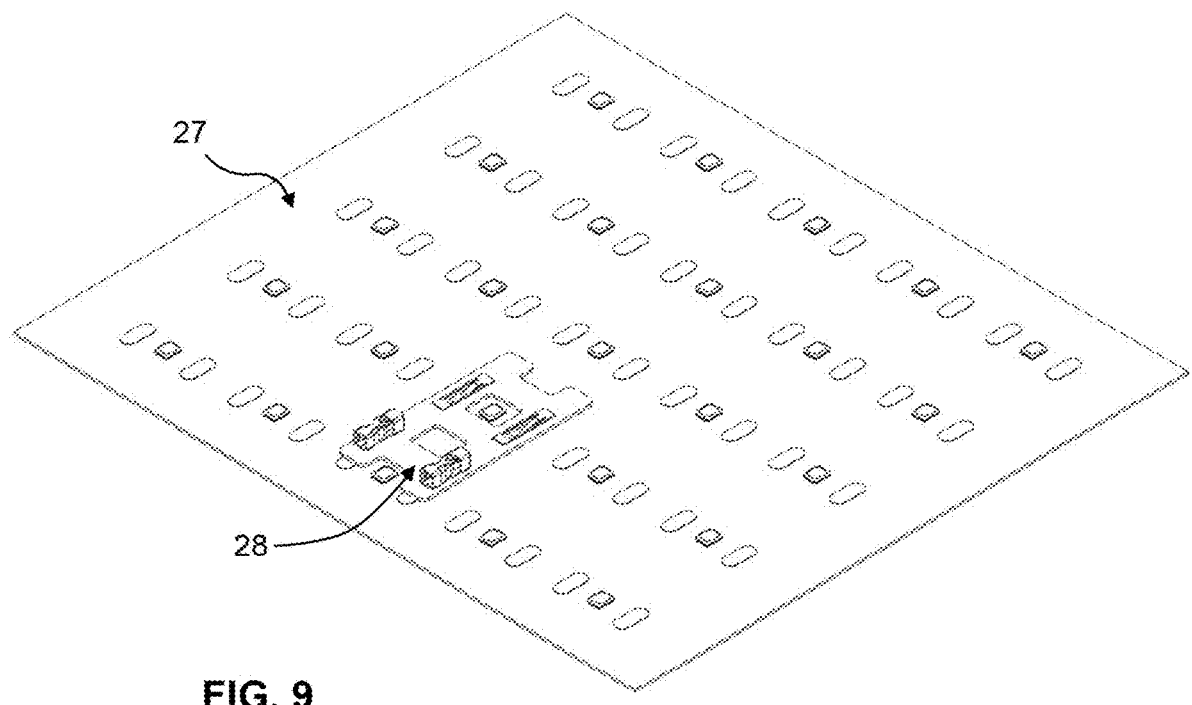
FIG. 9 shows an isometric view of a planar PCB having a matrix of LEDs and discontinuous electronic conductors and attached to a terminal block housing, according to an embodiment.

FIG. 9 shows an isometric view of an LED PCB with LEDs and conductive pads in a planar matrixed configuration, according to an embodiment. More specifically, PCB substrate 27 has a planar square shape or a planar rectangular shape (as opposed to a strip-like shape significantly longer in one dimension than another dimension). The PCB substrate 27 is coupled to multiple LEDs and multiple conductive pads positioned (disposed) in a matrixed configuration. For example, the LEDs and the conductive pads can be positioned on the PCB substrate 27 in rows and columns to define a matrix-like arrangement. Each LED can be disposed between a pair of conductive pads. Also shown in FIG. 9, terminal block 28 can be positioned on the PCB substrate 27 so that conductive positions on the underside of the terminal block 28 can contact substantially aligned conductive pads on the PCB substrate 27. The terminal block 28 can be attached to the PCB substrate 27, for example, by an adhesive that fixedly couples the terminal block 28 to the PCB substrate 27.

Figure 10:
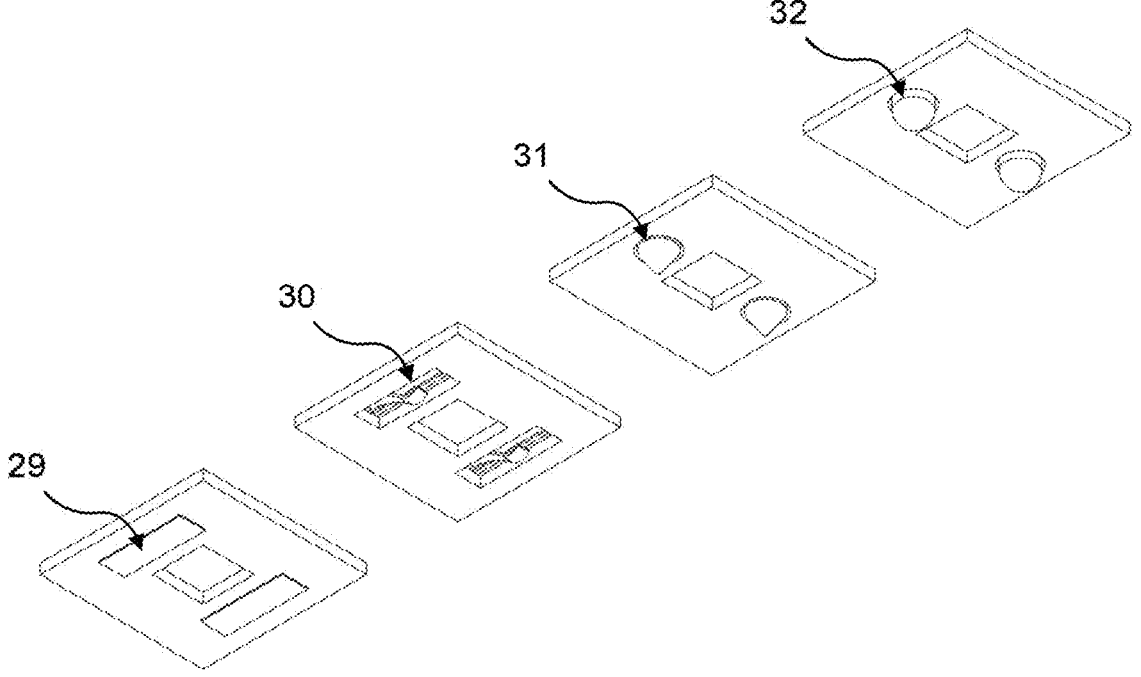
FIG. 10 shows an isometric view of various types of terminal block housings, according to various embodiments.

FIG. 10 shows an a bottom isometric view of various types of terminal block housings, according to various embodiments. Although not explicitly shown in and/or discussed with respect to FIGS. 1-9, it should be understood that any of the various types of terminal block housings and/or the techniques to attach the terminal block housings to an LED PCB can be used with any of the embodiments described here as applicable. For example, although FIGS. 1 and 2 are discussed in connection with a terminal housing block that can be attached to a PCB substrate using an adhesive similar to the discussion below of terminal block housing 29, any of the terminal housing blocks 30, 31 and 32 can be used interchangeably. In other words, any of the embodiments of the terminal block housings discussed herein can be of any of the types of terminal block housings discussed in connection with FIG. 10.

For example, terminal block housing can have a pair of conductive pads, one on each side of an aperture (window) that can be positioned around an LED on an LED PCB (for example, a strip-like LED PCB of FIGS. 1-8 or a planar-like LED PCB of FIG. 9). The conductive pads 29 of the terminal block housing can be positioned on an LED PCB so that conductive pads 29 on the underside of the terminal block housing can contact substantially-aligned conductive pads on the PCB. The terminal block housing can be attached to the LED PCB, for example, by an adhesive that fixedly couples the terminal block housing to the LED PCB.

For another example, terminal block housing can have a pair of spring contacts 30, one on each side of an aperture (window) that can be positioned around an LED on an LED PCB. The spring contacts 30 of the terminal block housing can be positioned on an LED PCB so that the underside of the spring contacts 30 of terminal block housing can contact substantially-aligned conductive pads on the LED PCB. More specifically, the terminal block housing can be attached to the LED PCB, for example, by an adhesive that fixedly couples the terminal block housing to the LED PCB in such a manner that a bias the spring contacts 30 of the terminal block housing applies a force that maintains contact with the conductive pads of the LED PCB.

For another example, terminal block housing can have a pair of piercing contacts 31, one on each side of an aperture (window) that can be positioned around an LED on an LED PCB. Rather than using an adhesive to attach the terminal block housing to the LED PCB, the piercing contacts 31 can have cone-like projections on the underside of the terminal block housing can pierce the LED PCB to maintain the position of the terminal block housing relative to the LED PCB.

For yet another example, terminal block housing can have a pair of press fit pins 32, one on each side of an aperture (window) that can be positioned around an LED on an LED PCB. Again, rather than using an adhesive to attach the terminal block housing to the LED PCB, the press fit pins 32 can have hemisphere-like projections on the underside of the terminal block housing can press fit into substantially-aligned holes in the LED PCB to maintain the position of the terminal block housing relative to the LED PCB.

FIG. 11 shows an isometric view of an LED PCB with a terminal block housing having four electrical conductors, according to an embodiment. In this embodiment, the LED PCB has a strip-like shape with a series of LEDs disposed along the PCB substrate lengthwise substantially in the middle (centerline) of the PCB substrate. The LED PCB also has a series of conductive pad pairs disposed along the PCB substrate lengthwise, where an LED disposed between each conductive pad pair. The terminal block housing has a rectangular-like shape with four apertures (windows) that are substantially-aligned with four LEDs on the LED PCB such that the four LEDs are not covered by the terminal block housing. The terminal block housing includes a segment with four electrical conductors, along with four wire terminals. The four wire terminals each can accept a separate wire coupled to an external power source (not shown) and is conductively coupled to a respective electrical conductor that is conductively coupled with a conductive pad of the LED PCB when the terminal block housing is attached to the LED PCB.

Figure 12:
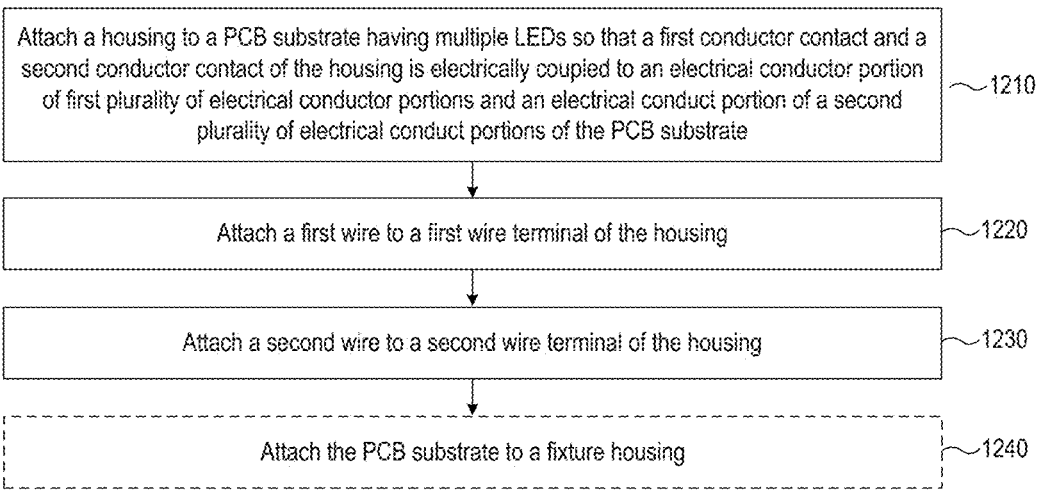
FIG. 12 shows a flowchart of a method for installing a housing to a PCB substrate, according to an embodiment.

FIG. 12 shows a flowchart of a method for installing a housing to a PCB substrate, according to an embodiment. At 1210, a housing (e.g., a terminal block housing, for example, any of the terminal block housings discussed above in reference to FIGS. 1-11) is attached to a PCB substrate that has multiple LEDs. The housing is attached to the PCB substrate so that a first conductor contact of the housing is electrically coupled to an electrical conductor portion of a first set of electrical conductor portions of the PCB substrate, and a second conductor contact of the housing is electrically coupled to an electrical conductor portion of a second set of electrical conductor portions of the PCB substrate. For example in reference to FIGS. 1 and 2, the terminal block housing 5 can be attached to the PCB substrate 1 by electrically coupling a conductive contact 9 of the terminal block housing 5 to an electrical conductor 3 on one side of the PCB substrate 1, and by electrically coupling the other conductive contract 9 of the terminal block housing 5 to the other electrical conductor 3 on the other side of the PCB substrate 1.

At 1220, after the housing has been attached to the PCB substrate, a first wire is attached to one wire terminal of the housing. Similarly, at 1230, after the housing has been attached to the PCB substrate, a second wire is attached to the other wire terminal of the housing. The first and second wires are electrically coupled to an external power source (not shown) so that power is provided to the LEDs attached to the PCB substrate when the LEDs are operative. Following the example of FIGS. 1 and 2, the two wire feeds 4 can be inserted into the two wire terminals 6 of the terminal block housing 5.

At optional 1240, the PCB substrate is attached to a fixture housing (also referred to herein as "an architectural fixture"; not shown). This optional 1240 can be performed at any time relative to 1210, 1220 and 1230. For example, the PCB substrate can be attached to a fixture housing before or after the housing is attached to the PCB substrate and the wires are attached to the housing.

In some embodiments, attaching the housing to the PCB substrate includes removably coupling an alignment tool with an alignment portion of the housing. In some embodiments, attaching the housing to the PCB substrate includes fixedly attaching the housing to the PCB substrate.

In some embodiments, the first plurality of electronic conductor portions form a first continuous elongate exposed electrical conductor, the second plurality of electronic conductor portions form a second continuous elongate exposed electrical conductor. The plurality of LEDs are disposed between the first continuous elongate exposed electrical conductor and the second continuous elongate exposed electrical conductor. The housing is configured to be attached to the PCB substrate at any location of the first continuous elongate exposed electrical conductor and any location of the second continuous elongate exposed electrical conductor.

In some embodiments, the first plurality of electronic conductor portions form a first plurality of discontinuous electrical conductors, the second plurality of electronic conductor portions form a second plurality of discontinuous electrical conductors, the plurality of LEDs are disposed between the first discontinuous electrical conductors and the second discontinuous electrical conductors. The housing is configured to be attached to the PCB substrate at any discontinuous electrical conductor from the first plurality of discontinuous electrical conductors and any discontinuous electrical conductor from the second plurality of discontinuous electrical conductors.

In some embodiments, the first plurality of electronic conductor portions form a first plurality of discontinuous electrical conductors. The second plurality of electronic conductor portions form a second plurality of discontinuous electrical conductors. The plurality of LEDs are disposed between the first discontinuous electrical conductors and the second discontinuous electrical conductors. The housing is configured to be attached to the PCB substrate at any discontinuous electrical conductor from the first plurality of discontinuous electrical conductors and any discontinuous electrical conductor from the second plurality of discontinuous electrical conductors. The housing spans a distance between the discontinuous electrical conductor from the first plurality of discontinuous electrical conductors attached to the housing and the discontinuous electrical conductor from the second plurality of discontinuous electrical conductors attached to the housing. The housing is translucent or transparent to the LED from the plurality of LEDs disposed between the housing and the PCB substrate, the plurality of LEDs forming a continuous strip.

In some embodiments, the plurality of LEDs has at least two LEDs aligned in a first direction and at least two LEDs aligned in a second direction substantially orthogonal to the first direction. The first plurality of electronic conductor portions form a first plurality of discontinuous electrical conductors. The second plurality of electronic conductor portions form a second plurality of discontinuous electrical conductors. Each LED from the plurality of LEDs is disposed between a discontinuous electrical conductor from the first discontinuous electrical conductors and a discontinuous electrical conductor from the second discontinuous electrical conductors. The housing is configured to be attached to the PCB substrate at any discontinuous electrical conductor from the first plurality of discontinuous electrical conductors and any discontinuous electrical conductor from the second plurality of discontinuous electrical conductors.

In some embodiments, the first wire is from an electrical component and the second wire is from the electronic component.

All combinations of the foregoing concepts and additional concepts discussed here (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The skilled artisan will understand that the drawings primarily are for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

To address various issues and advance the art, the entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisionals, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about", "substantially" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

While specific embodiments of the present disclosure have been outlined above, many alternatives, modifications, and variations will be apparent to those skilled in the art. Accordingly, the embodiments set forth herein are intended to be illustrative, not limiting. Various changes may be made without departing from the spirit and scope of the disclosure.

What is claimed is:

1. A system, comprising:
a printed circuit board (PCB) substrate having a plurality of light emitting diodes (LEDs), a first plurality of electrical conductor portions and a second plurality of electrical conductor portions; and
a housing having a first side and a second side opposite the first side, the housing having on the first side a first wire terminal and a second wire terminal, the housing having on the second side a first conductor contact and a second conductor contact,
the housing configured to be attachable to the PCB substrate so that first conductor contact is electrically coupled to an electrical conductor portion from the first plurality of electrical conductor portions and the second conductor contact is electrically coupled to an electrical conductor portion from the second plurality of electrical conductor portions,
the first plurality of electronic conductor portions form a first continuous elongate exposed electrical conductor, the second plurality of electronic conductor portions form a second continuous elongate exposed electrical conductor, the plurality of LEDs are disposed between the first continuous elongate exposed electrical conductor and the second continuous elongate exposed electrical conductor,
the housing configured to be attached to the PCB substrate at any location of the first continuous elongate exposed electrical conductor and any location of the second continuous elongate exposed electrical conductor.

2. The system of claim 1, wherein the first wire terminal is configured to receive a first wire from an electrical component and the second wire terminal is configured to receive a second wire from the electronic component.

3. The system of claim 1, wherein the housing is configured to be fixedly attachable to the PCB substrate.

4. The system of claim 1, wherein the first conductor contact and the second conductor contact each is at least one of a conductive pad, a spring contact, a piercing contact or a press fit pin.

5. The system of claim 1, wherein the first wire terminal and the second wire terminal each is at least one of a spring-loaded push-in terminal, a screw terminal, a insulation- displacement contact, a JST connector, or a soldering pad.

6. The system of claim 1, wherein the housing includes an align portion configured to receive an alignment tool to facilitate alignment of the housing relative to the PCB substrate when the housing is attached to the PCB substrate.

7. A system, comprising:

a printed circuit board (PCB) substrate having a plurality of light emitting diodes (LEDs), a first plurality of electrical conductor portions and a second plurality of electrical conductor portions; and a housing having a first side and a second side opposite the first side, the housing having on the first side a first wire terminal and a second wire terminal, the housing having on the second side a first conductor contact and a second conductor contact, the housing configured to be attachable to the PCB substrate so that first conductor contact is electrically coupled to an electrical conductor portion from the first plurality of electrical conductor portions and the second conductor contact is electrically coupled to an electrical conductor portion from the second plurality of electrical conductor portions, the plurality of LEDs having at least two LEDs aligned in a first direction and at least two LEDs aligned in a second direction substantially orthogonal to the first direction, the first plurality of electronic conductor portions form a first plurality of discontinuous electrical conductors, the second plurality of electronic conductor portions form a second plurality of discontinuous electrical conductors, each LED from the plurality of LEDs is disposed between a discontinuous electrical conductor from the first discontinuous electrical conductors and a discontinuous electrical conductor from the second discontinuous electrical conductors, the housing configured to be attached to the PCB substrate at any discontinuous electrical conductor from the first plurality of discontinuous electrical conductors and any discontinuous electrical conductor from the second plurality of discontinuous electrical conductors.

8. The system of claim 7, wherein:

the housing spanning a distance between the discontinuous electrical conductor from the first plurality of discontinuous electrical conductors attached to the housing and the discontinuous electrical conductor from the second plurality of discontinuous electrical conductors attached to the housing, the housing being translucent or transparent to the LED from the plurality of LEDs disposed between the housing and the PCB substrate, the plurality of LEDs forming a continuous strip.

9. A method, comprising:

attaching a housing to a printed circuit board (PCB) substrate having a plurality of light emitting diodes (LEDs) so that a first conductor contact of the housing is electrically coupled to an electrical conductor portion from a first plurality of electrical conductor portions of the PCB substrate and a second conductor contact of the housing is electrically coupled to an electrical conductor portion from a second plurality of electrical conductor portions of the PCB substrate; and attaching a first wire to a first wire terminal of the housing and a second wire to a second wire terminal of the housing, the housing having a first side and a second side opposite the first side, the housing having on the first side the first wire terminal and the second wire terminal, the housing having on the second side the first conductor contact and the second conductor contact, the first plurality of electronic conductor portions form a first continuous elongate exposed electrical conductor, the second plurality of electronic conductor portions form a second continuous elongate exposed electrical conductor, the plurality of LEDs are disposed between the first continuous elongate exposed electrical conductor and the second continuous elongate exposed electrical conductor, the housing configured to be attached to the PCB substrate at any location of the first continuous elongate exposed electrical conductor and any location of the second continuous elongate exposed electrical conductor.

10. The method of claim 9, further comprising:

attaching the PCB substrate to a fixture housing before attaching the housing to the PCB substrate and before attaching the first wire and the second wire.

11. The method of claim 9, further comprising:

attaching the PCB substrate to a fixture housing after attaching the housing to the PCB substrate and before attaching the first wire and the second wire.

12. The method of claim 9, wherein attaching the housing to the PCB substrate includes removably coupling an alignment tool with an alignment portion of the housing.

13. The method of claim 9, wherein attaching the housing to the PCB substrate includes fixedly attaching the housing to the PCB substrate.

14. The method of claim 9, wherein the first wire is from an electrical component and the second wire is from the electronic component.

15. A method, comprising:

attaching a housing to a printed circuit board (PCB) substrate having a plurality of light emitting diodes (LEDs) so that a first conductor contact of the housing is electrically coupled to an electrical conductor portion from a first plurality of electrical conductor portions of the PCB substrate and a second conductor contact of the housing is electrically coupled to an electrical conductor portion from a second plurality of electrical conductor portions of the PCB substrate; and attaching a first wire to a first wire terminal of the housing and a second wire to a second wire terminal of the housing, the housing having a first side and a second side opposite the first side, the housing having on the first side the first wire terminal and the second wire terminal, the housing having on the second side the first conductor contact and the second conductor contact, the first plurality of electronic conductor portions form a first plurality of discontinuous electrical conductors, the second plurality of electronic conductor portions form a second plurality of discontinuous electrical conductors, the plurality of LEDs are disposed between the first discontinuous electrical conductors and the second discontinuous electrical conductors, the housing configured to be attached to the PCB substrate at any discontinuous electrical conductor from the first plurality of discontinuous electrical conductors and any discontinuous electrical conductor from the second plurality of discontinuous electrical conductors, the housing spanning a distance between the discontinuous electrical conductor from the first plurality of discontinuous electrical conductors attached to the housing and the discontinuous electrical conductor from the second plurality of discontinuous electrical conductors attached to the housing, the housing being translucent or transparent to the LED from the plurality of LEDs disposed between the housing and the PCB substrate, the plurality of LEDs forming a continuous strip.

16. The method of claim 15, wherein:

the plurality of LEDs having at least two LEDs aligned in a first direction and at least two LEDs aligned in a second direction substantially orthogonal to the first direction.

\* \* \* \* \*